United States Patent [19]

Mou et al.

[11] Patent Number: 5,705,944
[45] Date of Patent: Jan. 6, 1998

[54] METHOD AND DEVICE FOR DETECTING INTERNAL RESISTANCE VOLTAGE DROP ON A CHIP

[75] Inventors: Ya-Nan Mou, Taipei; Chien-Chung Pan, Taichung, both of Taiwan

[73] Assignee: United Microelectronics Corp., Hsinchu, Taiwan

[21] Appl. No.: 662,690

[22] Filed: Jun. 13, 1996

[51] Int. Cl.$^6$ ............................................. H03K 5/24
[52] U.S. Cl. ........................ 327/74; 327/71; 327/76; 327/78
[58] Field of Search .................. 327/50, 56, 57, 327/58, 62, 63, 64, 68–72, 74–82

[56] References Cited

U.S. PATENT DOCUMENTS

| | | | |
|---|---|---|---|
| 5,406,247 | 4/1995 | Nagaraj | 327/71 |
| 5,565,801 | 10/1996 | Ernst | 327/74 |
| 5,652,533 | 7/1997 | Wong et al. | 327/76 |

*Primary Examiner*—Timothy P. Callahan
*Assistant Examiner*—T. T. Lam
*Attorney, Agent, or Firm*—Barnes, Kisselle, Raisch, Choate, Whittemore & Hulbert, P.C.

[57] ABSTRACT

The present invention provides a method and apparatus for detecting voltage drops on an IC chip. The device operates by using a reference voltage to detect the voltage range of a local voltage. A multiple number of reference voltages are used (or predetermined) between the reference voltage and the ground voltage. The voltage drop detecting device includes a multiple number of inverters having to the local voltage as its input. The inverters each have a trigger voltage corresponding to one of the reference positions. When the local voltage is smaller than the trigger voltage of the inverter, a low to high voltage switching is present at the output. A multiple number of positive-edge triggering devices, coupled to the reference voltage as one of its inputs, are each coupled to one of the inverters. A corresponding inverter presents a low to high switching to make the reference voltage present at the corresponding output terminal. The voltage range of the local voltage is detected at the output terminals.

10 Claims, 3 Drawing Sheets

METHOD AND DEVICE FOR DETECTING INTERNAL RESISTANCE VOLTAGE DROP ON A CHIP

FIELD OF THE INVENTION

The present invention generally relates to a voltage drop detecting device and more particularly, relates to a voltage drop detecting device on a semiconductor chip utilizing a reference voltage to detect a local voltage range.

BACKGROUND OF THE INVENTION

When a semiconductor integrated circuit chip is fabricated in a factory, it is normally tested in a series of reliability and quality control tests for quality assurance purposes. Among these tests, an internal resistance (IR) voltage drop test is conducted to determine whether there is any local voltage drop problems. The test is conducted by either mechanical probing or electron-beam probing. It is tested against a set of test patterns in order to determine the voltage at various locations of a semiconductor die. This kind of test is not only time consuming, but also requires a broad coverage of the test pattern as well as a large number of test points. In a modern integrated circuit device, numerous metal contact layers render such test extremely difficult i.e., the bottom metal contact layer can be difficult to reach. Furthermore, in certain defective IC dies, due to the very short time period of a voltage drop, a physical inspection of a meter or other test device can easily cause such a detection to be missed. It is therefore desirable to provide other test methods that can reliably detect IR voltage drops on an integrated circuit chip.

It is therefore an object of the present invention to provide a method and device to detect IR voltage drops that can be directly built into an integrated circuit chip to detect a local voltage drop on the chip.

SUMMARY OF THE INVENTION

The present invention provides a method and apparatus for detecting voltage drops on an IC chip. The device operates by using a reference voltage to detect the voltage range of a local voltage. A multiple number of reference sub-voltages are used (or predetermined) between the reference voltage and the ground voltage. The voltage drop detecting device includes a multiple number of inverters having to the local voltage as its input. The inverters each have a trigger voltage corresponding to one of the reference positions. When the local voltage is smaller than the trigger voltage of the inverter, a low to high voltage switching is present at the output. A multiple number of positive-edge triggering devices, coupled to the reference voltage as one of its inputs, are each coupled to one of the inverters. A corresponding inverter presents a low to high switching to make the reference voltage present at the corresponding output terminal. The voltage range of the local voltage is detected at the output terminals or can also be read by software.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
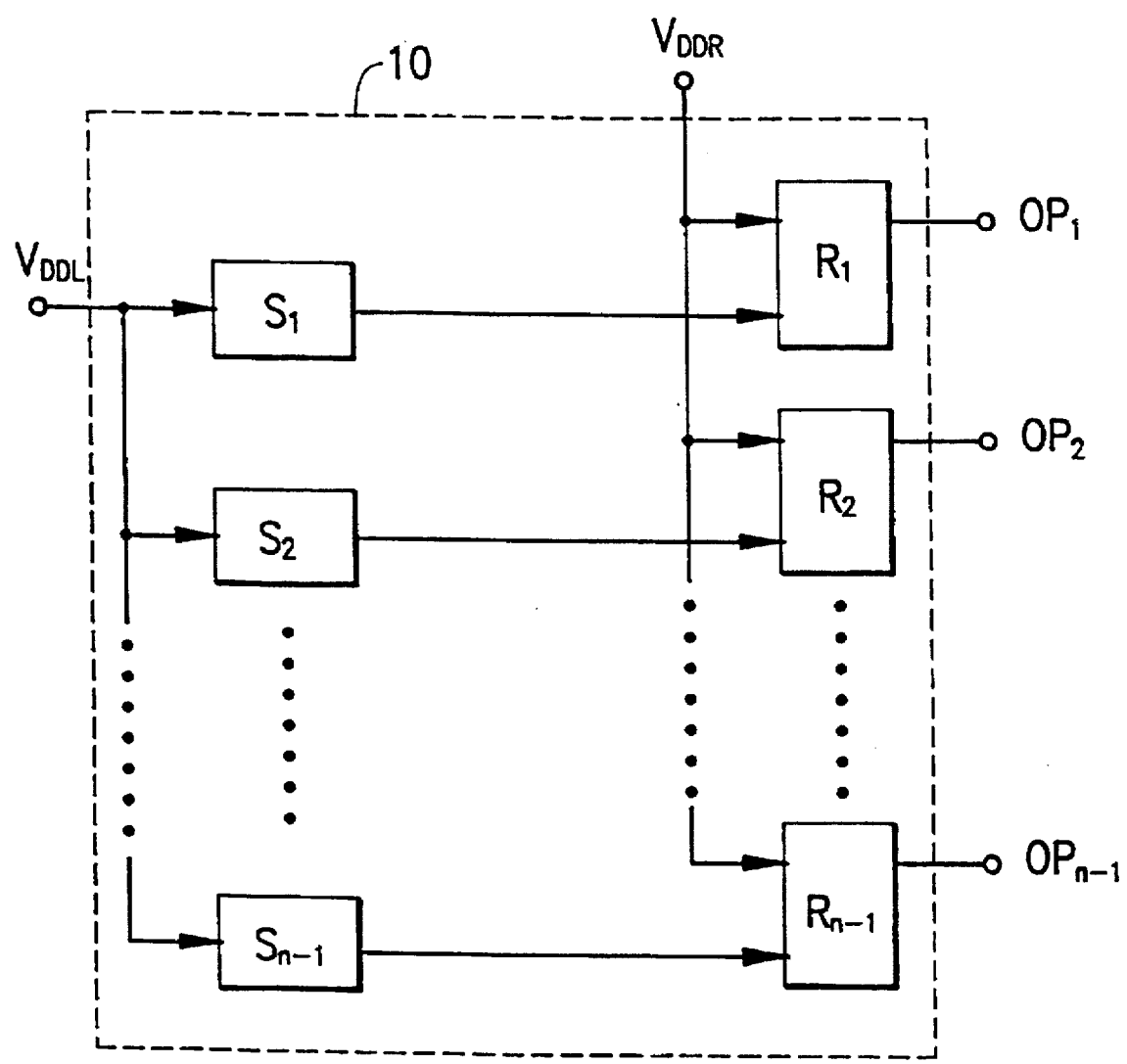
FIG. 1 is a circuit diagram illustrating the preferred embodiment of the present invention.

Referring initially to FIG. 1, a block diagram illustrating the preferred embodiment of the present invention is shown. In FIG. 1, $V_{DDR}$ is a reference voltage taken directly from an independent voltage source node. The reference voltage $V_{DDR}$ preferably is not connected to any other logic circuits to avoid voltage drops caused by the other circuits. $V_{DDL}$ is a local voltage of a local node in the internal circuit. The present invention utilizes a reference voltage $V_{DDR}$ to detect the voltage drop of a local voltage $V_{DDL}$.

The local voltage $V_{DDL}$ is connected individually to detectors $S_1, S_2, \ldots S_{n-1}$ as the input signal to the detectors. After detected by detectors $S_1, S_2, \ldots S_{n-1}$, the local voltage $V_{DDL}$ is coupled to corresponding registers $R_1, R_2, \ldots R_{n-1}$. The reference voltage $V_{DDR}$ is also coupled to each register $R_1, R_2, \ldots R_{n-1}$ as their other input terminal, and then as an output at output terminals $OP_1, OP_2 \ldots Op_{n-1}$.

The reference voltage $V_{DDR}$ can be divided into n ranges, such that there are (n-1) reference sub-voltages between the reference voltage $V_{DDR}$ and the ground voltage. For instance, the reference voltage can be $1/n\, V_{DDR}, \ldots, n-1/n\, V_{DDR}$ such that the trigger voltage of (n-1) detectors each belonging to the (n-1) reference sub-voltages. The trigger voltage for detector $S_1$ can be sequentially as $n-1/n\, V_{DDR}$, for $S_2$ as $n-2/n\, V_{DDR}$, for $S_{n-2}$ as $2/n\, V_{DDR}$, and for $S_{n-1}$ as $1/n\, V_{DDR}$.

If registers $R_1, R_2, \ldots, R_{n-1}$ are positive-edge triggering devices, then the input voltage $V_{DDL}$ for detectors $S_1, S_2, \ldots, S_{n-1}$ is smaller than the triggering voltage, the corresponding detectors $S_1, S_2, \ldots, S_{n-1}$ will be reset to present a low to high switching. Therefore, individually driving the corresponding registers $R_1, R_2, \ldots, R_{n-1}$ places the reference voltage $V_{DDR}$ at each corresponding output terminals $OP_1, OP_2, \ldots, Op_{n-1}$. Otherwise, the output terminals still maintain their original position. The voltage range of the local voltage $V_{DDL}$ can be obtained from the output pattern of the output terminals ($OP_1, OP_2, \ldots, OP_{n-1}$).

Figure 2:
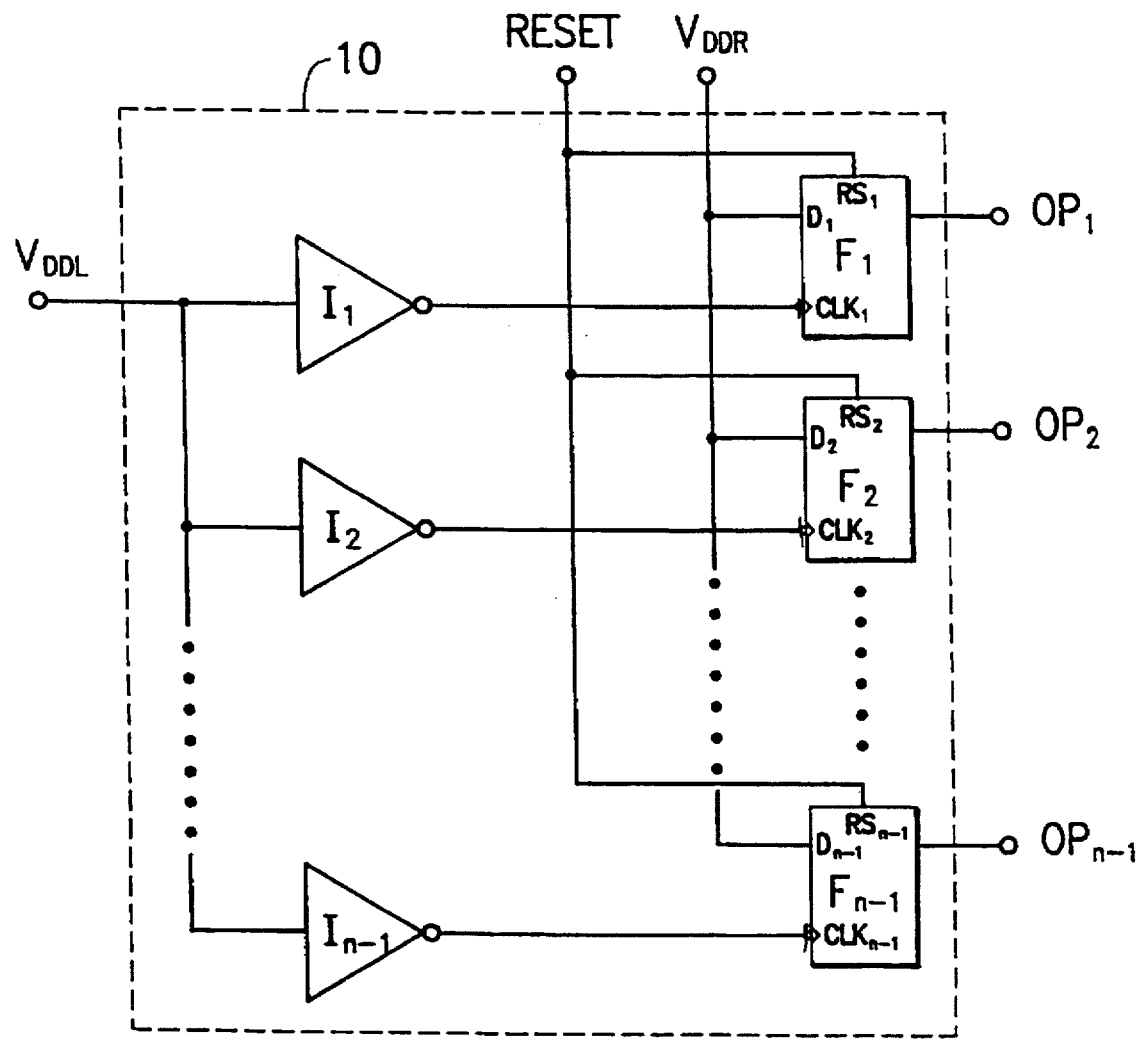
FIG. 2 is a circuit diagram illustrating a voltage drop detecting device utilizing inverters as detectors and D-type flip-flops as registers.

Referring now to FIG. 2, a circuit diagram is shown by using inverters as detectors and D-type flip-flops as registers. Local voltage $V_{DDL}$ is connected to the input terminal of the inverters $I_1, I_2, \ldots, I_{n-1}$. The D-type flip-flops $F_1, F_2, \ldots, F_{n-1}$ each individually correspond to inverters $I_1, I_2, \ldots, I_{n-1}$. The output terminal of inverters $I_1, I_2, \ldots, I_{n-1}$, after inverting the local voltage $V_{DDL}$, are connected to the individual timing control terminals $CLK_1, CLK_2, \ldots, CLK_{n-1}$ of the D-type flip-flops $F_1, F_2, \ldots, F_{n-1}$. Furthermore, the reference voltage $V_{DDR}$ is simultaneously connected to the input terminals $D_1, D_2, \ldots, D_{n-1}$ of the flip-flops. The output terminals are $OP_1, OP_2, \ldots, OP_{n-1}$. A reset signal is received by the reset control terminal $RS_1, RS_2, \ldots, RS_{n-1}$ of the flip-flops. It should be noted that all the elements in the voltage drop detecting device 10 should use $V_{DDR}$ as the voltage source. As shown in FIG. 2, $V_{DDR}$ is used as a source voltage for both the inverters and for the D-type flip-flops.

If the reference voltage $V_{DDR}$ is divided into n stages, then there are (n-1) reference sub-voltages between the reference voltage $V_{DDR}$ and the ground voltage, i.e., $n-1/n\, V_{DDR}, n-2/n\, V_{DDR}, \ldots, 1/n\, V_{DDR}$. The triggering voltage of the inverters $I_1, I_2, \ldots, I_{n-1}$ (or the drive voltage for the high to low logic switching of the inverter) will then belong to each of the (n−1) reference sub-voltages for detecting the local voltage $V_{DDL}$. When the local voltage $V_{DDL}$ is smaller than the triggering voltage of a particular inverter, the output terminal of the inverter will present a "0" to "1" voltage switching. Otherwise, the output terminal of the inverter will maintain at the high logic position.

The output terminals $OP_1$, $OP_2$, ..., $OP_{n-1}$ of the flip-flops $F_1$, $F_2$, ..., $F_{n-1}$, are reset to "0" upon initialization through each reset control terminal $RS_1$, $RS_2$, ..., $RS_{n-1}$ when a reset signal Reset is present. When the output terminals of the above described inverters are switched from "0" to "1", the timing sequence control terminal presents corresponding reference voltage $V_{DDR}$ to the output terminals of the flip-flops. The voltage range of the local voltage $V_{DDL}$ can be detected by the data read from the flip-flops $F_1$, $F_2$, ..., $F_{n-1}$.

An example of one implementation of the circuit of FIG. 2 assumes $V_{DDR}$=5V, the value of $V_{DDL}$ is affected by the voltage drop to read 3.8V and n=5. The triggering voltage for inverter $I_1$ is 4V, for $I_2$ is 3V, for $I_3$ is 2V, and for $I_4$ is 1V. The triggering voltage of 4V of inverter $I_1$ is larger than $V_{DDL}$, thus the output terminal of $I_1$ is driven from a "0" to "1" switching state. The other inverters $I_2$~$I_4$ maintain their output positions. Furthermore, the "1" to "0" output switching of inverter $I_1$ drives the flip-flop $F_1$ such that the reference voltage $V_{DDR}$ is present at output terminal $OP_1$. The other output terminals $OP_2$-$OP_4$ still maintains a "0" position after reset. The local voltage $V_{DDL}$ is therefore in the range between 3~4V from the output logic status of the output terminal ($OP_1$, $OP_2$, ..., $OP_4$)=(1, 0, 0, 0).

Figure 3:
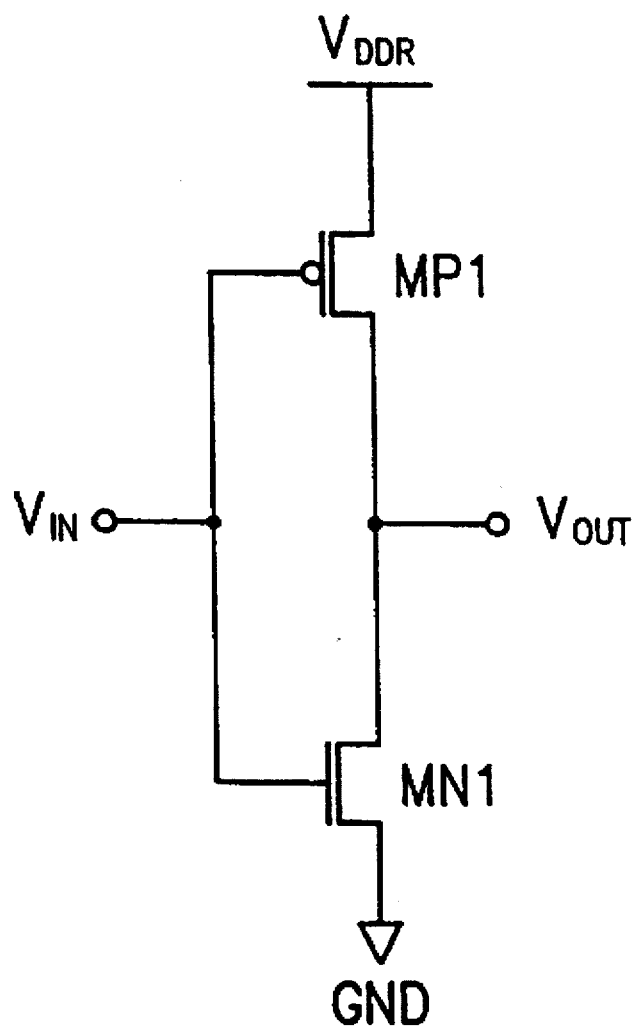
FIG. 3 is a circuit diagram illustrating an inverter constructed of a PMOS transistor and an NMOS transistor.

Referring to FIG. 3, the inverters described above are shown to be constructed by connecting a PMOS transistor MP1 and an NMOS transistor $MN_1$ in series. The gates of the PMOS transistor MP1 and the NMOS transistor MN1 are both coupled to the input terminal $V_{in}$. The drains of the transistors MP1 and MN1 are both coupled to an output terminal $V_{out}$. The source of the PMOS transistor is connected to the reference voltage $V_{DDR}$, while the source of the NMOS transistor MN1 is connected to the ground GND. The adjustment of the triggering voltage of the inverter can be obtained by changing the size (i.e., the dimensions of the width and length of the transistor on the die) of the PMOS and NMOS transistors. The transistor MP1 and the transistor MN1 can be implemented using other topologies to meet the design criteria of a particular application.

The present invention voltage drop detection device can be built directly into local nodes of a semiconductor integrated circuit depending on the design criteria of a particular application. It can be used to detect the local voltage position of the internal circuit in order to determine whether there is a voltage drop problem occurring. The present invention greatly improves the benefits over the conventionally available detection methods of mechanical probing or electron-beam probing.

While the present invention has been described in an illustrative manner, it should be understood that the terminology used is intended to be in a nature of words of description rather than a limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A voltage drop detecting device using a reference voltage to detect a voltage range of a local voltage wherein a multiple reference sub-voltages are preset between the reference voltage and a ground voltage, said voltage drop detecting device comprising:

a plurality of inverters each receiving an input from the local voltage, each of said plurality of inverters having a triggering voltage corresponding to one of said preset reference sub-voltages, wherein a low to high voltage switching and outputting occurs at output terminal of said plurality of inverters when said local voltage is smaller than said triggering voltage of a corresponding inverter, and a plurality of positive-edge triggering devices each having a source input coupled to said reference voltage, a clock input coupled to one of said plurality of inverters and an output terminal, when a particular one of said plurality of inverters switches from said low to high switching state the reference voltage is presented at the corresponding output terminal of said positive-edge triggering device, said voltage range of the local voltage being determined by the reference voltage.

2. A voltage drop detecting device according to claim 1 wherein each inverter comprises:

a first transistor having a gate coupled to said local voltage and a source coupled to said reference voltage, and a second transistor having a gate coupled to said local voltage and a source coupled to said ground voltage, a drain coupled to the drain of said first transistor for outputting said low to high voltage switching.

3. A voltage drop detecting device according to claim 2, wherein the triggering voltage of each said inverter can be obtained by adjusting the size of said first and said second transistors.

4. A voltage drop, detecting device according to claim 2, wherein said first transistor is a PMOS transistor.

5. A voltage drop detecting device according to claim 2, wherein said second transistor is an NMOS transistor.

6. A voltage drop detecting device according to claim 1, wherein said each positive-edge triggering device is a flip-flop.

7. A voltage drop detecting device according to claim 1, wherein said each positive-edge triggering device is a D-type flip-flop.

8. A voltage drop detecting device using a reference voltage to detect a voltage range of a local voltage having a multiple reference sub-voltages between said reference voltage and a ground voltage, said voltage drop detecting device comprising:

a plurality of detectors each coupled to receive the local voltage, each detector having a triggering voltage corresponding to one of said multiple reference sub-voltages, each detector outputs a voltage switching when said local voltage is smaller than said triggering voltage of a corresponding detector, and a plurality of registers each receiving a first input from said reference voltage, a second input from one of said plurality of detectors and an output terminal, when said voltage switching outputted by said corresponding detector and said reference voltage is present at said corresponding output terminal of said registers, said voltage range of said local voltage is obtained at said output terminal.

9. A voltage drop detecting device according to claim 8, wherein said voltage switching is from low high voltage switching.

10. A voltage drop detecting device according to claim 9, wherein each of said register is a positive-edge triggering device.

* * * * *